United States Patent [19]

Shekerjian et al.

[11] 3,723,836

[45] Mar. 27, 1973

[54] HIGH POWER SEMICONDUCTOR DEVICE INCLUDED IN A STANDARD OUTLINE HOUSING

[75] Inventors: Hart Shekerjian, Scottsdale; Stanley R. Oulman, Phoenix, both of Ariz.

[73] Assignee: Motorola, Inc., Franklin Park, Ill.

[22] Filed: Mar. 15, 1972

[21] Appl. No.: 234,766

[52] U.S. Cl. ........317/234 R, 317/234 A, 317/234 G, 317/234 H, 317/234 P, 29/589, 339/258

[51] Int. Cl. ..............................H01l 3/00, H01l 5/00

[58] Field of Search............317/234, 1, 4, 4.1, 5.4, 6, 317/11; 29/589; 339/241, 258

[56] References Cited

UNITED STATES PATENTS

| | | | |
|---|---|---|---|
| 2,852,723 | 9/1958 | Escoffery | 317/234 |
| 3,142,000 | 7/1964 | Bernstein | 317/234 X |
| 3,375,415 | 3/1968 | Finn | 317/234 |
| 3,471,757 | 10/1969 | Sias | 317/234 W |
| 3,483,444 | 12/1969 | Parrish | 317/234 |
| 3,546,544 | 12/1970 | Hudman | 317/234 |

*Primary Examiner*—John W. Huckert
*Assistant Examiner*—Andrew J. James
*Attorney*—Foorman L. Mueller et al.

[57] ABSTRACT

The device structure for dissipating large amounts of heat includes a plurality of paralleled semiconductor units having first terminals connected together by a first contact and second terminals connected together by a flexible member which is connected to a second contact. Housing members, one of which has an insulating portion, tend to mechanically hold the contacts in a spaced relation while electrically isolating them. The flexible member has a flat surface which abuts against the second contact and a plurality of flexible leg portions which each make electrical connection to one of the semiconductor units. The housing members and the flexible member cooperate to limit the magnitudes of forces applied to the semiconductor devices during fabrication. The flexible member is compressed by the completed housing to assure that electrical contact is sustained between the semiconductor units and the contacts even though parts of the device thermally expand during operation.

13 Claims, 8 Drawing Figures

Patented March 27, 1973 3,723,836

2 Sheets-Sheet 1

HIGH POWER SEMICONDUCTOR DEVICE INCLUDED IN A STANDARD OUTLINE HOUSING

BACKGROUND OF THE INVENTION

High power devices including a plurality of semiconductor units, for instance solid state power rectifiers capable of conducting forward currents in excess of 300 amperes and sustaining reverse voltages in excess of 800 volts, are required for use in industrial equipment, such as welders, platers, battery chargers and motor controls. Two basic structures for high power electrical devices have been generally employed. Devices having one structure each utilize a single large semiconductor wafer which has the capacity to conduct all of the required current. Devices having the other structure each include a plurality of smaller semiconductor wafers, each forming an individual unit having less current carrying or voltage withstanding capacity than the large wafer. These individual wafers are connected in parallel to conduct a desired quantity of current in a power rectifier. Also, the wafers are connected in series and parallel to provide a desired voltage clamping level in a power zener diode.

The composite rectifier or zener structures utilizing pluralities of paralleled diodes are preferred in some applications because they are more readily constructed to conduct large quantities of current. Also, if a junction of one of the diodes open circuits under a temporary overload the other junctions will continue to function. Moreover, heat is more easily dissipated because the peripheral surface area of a plurality of wafers is greater than the peripheral surface area of a single large wafer capable of conducting the same current.

Only a few different kinds of housing structures have been developed for connecting a plurality of diodes or other power semiconductor units in parallel in a single device. One commonly used device includes a first rigid, stud mountable contact for making electrical and physical contact with the cathode of each diode and a second rigid contact for making connection to the anode of each diode to thereby connect the diodes in parallel. A nonconductive housing is employed to hold the first and second contacts in a desired spaced relation with respect to each other. The housing electrically insulates the holds the two contacts.

Complex and expensive jigging assemblies may be required to properly align the parts of prior art devices and to protect the fragile diodes during assembly. Moreover, either or both of the rigid anode or cathode contacts sometimes fail to make connection with the diodes having the least length sandwiched between the contacts. Also, large amounts of heat generated by the semiconductor units during operation causes the rigid metal contacts and other parts of prior art devices to expand which sometimes subjects the diodes or other semiconductor units to thermal stresses which may pull them apart. Furthermore, some of these prior art structures are neither suitable for being included in housings of standard outline, which have been accepted for use in industrial equipment, nor are they suitable for allowing disassembly to facilitate salvage of good parts if testing indicates that the composite device is electrically defective.

SUMMARY OF THE INVENTION

One object of this invention is to provide an economical housing and contacting assembly having a standard outline which is suitable for connecting a plurality of individual, solid state units in parallel to form a composite power device.

Another object is to provide a device assemblage which includes a plurality of inexpensive, self aligning parts for connecting a plurality of semiconductor diodes in parallel.

Still another object is to provide a housing including a plurality of semiconductor units which generate large quantities of heat and which housing is able to absorb thermally created mechanical stresses without transmitting them to the semiconductor units.

A further object is to provide an electrical device, including a plurality of fragile semiconductor units, which is capable of being tested and disassembled before being finally sealed so that good parts thereof can be readily salvaged.

A still further object is to provide a flexible member which is suitable for use in a high power device including a plurality of fragile semiconductor units, and which flexible member protects the units from physical stresses during manufacture and from thermal stresses during operation.

In brief, the composite semiconductor high power device of the invention includes a first contact member which provides a supporting surface and a plurality of individual semiconductor units which each have end terminals placed in a spaced relation to each other on the supporting surface. A flexible member includes a plurality of flexible leg portions which make electrical contact with the other end terminals of the diodes, and a contact portion. A second contact member provides a contacting surface in electrical connection with the contact portion of the flexible member. Housing or connecting members mechanically hold the first and second contact members in a spaced relation with respect to each other while providing electrical isolation between the first and second contact members. The flexible member has a predetermined height which enables it to hold one housing member a predetermined distance away from another housing member during assembly. The flexible member and the housing members are designed so that the force necessary to close the first and second housing members does not harm the diodes when distributed to them by the leg portion of the flexible member. Hence, the flexible member and housing members cooperate to protect the diodes during assembly. After assembly, the structure of the composite device holds the flexible member in compression even though the first and second contact members and the housing members expand in response to temperature increase due to heat being dissipated by the power device.

DETAILED DESCRIPTION OF THE PREFERRED EMBODIMENT

Figure 1:
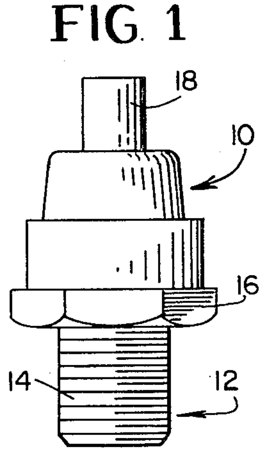
FIG. 1 is an approximately full scale view of a housing having a DO-9 outline.

FIG. 1 illustrates a housing 10 having a standardized outline which is drawn approximately full scale. This outline is designated as a "DO-9" type by the National Electrical Manufacturer's Association and it may include a high current solid state rectifier capable of conducting forward currents in excess of 300 amps and withstanding reverse voltages in excess of 800 volts or some other high power electrical device such as a zener diode utilized for clamping voltages accompanied by high surge currents. High current rectifiers are required in many types of industrial equipment such as battery chargers, platers and starters for electric motors and high power zener diodes are used as transient suppressors. According to accepted commercial usage, stud mountable contacting member 12 forms a cathode or negative terminal. Threaded stud 14 of member 12 facilitates mounting of the device to a heat sink or other structure. The hexagonally arranged flats of flange 16 facilitate tightening of the mount. Cylindrical contacting member 18 forms the anode or positive terminal for the device.

Figure 2:
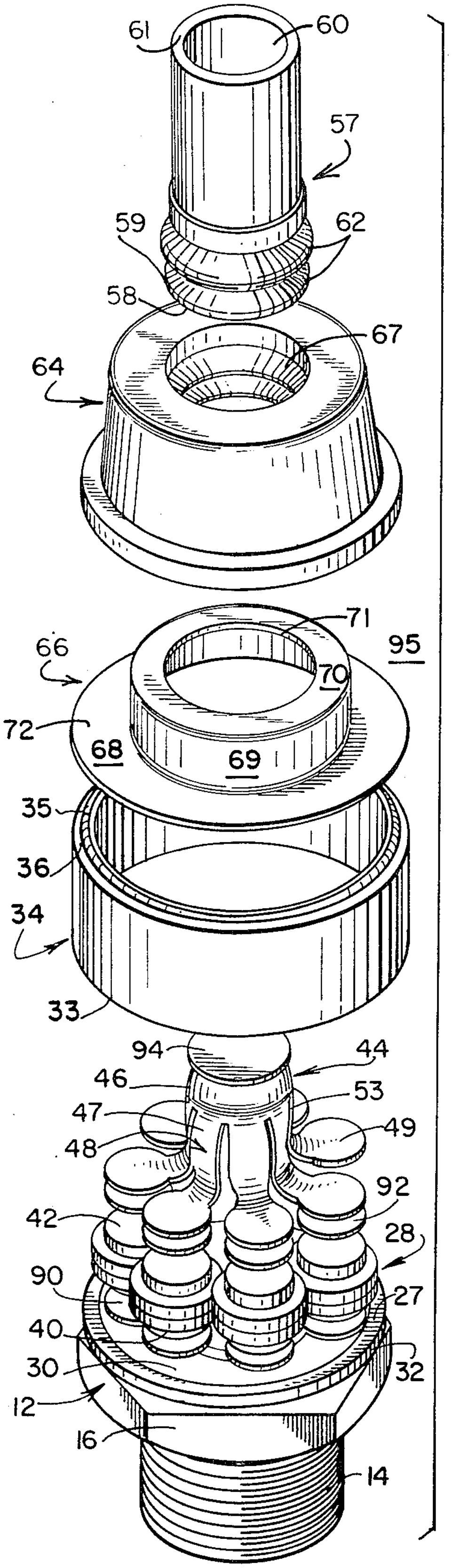
FIG. 2 is an enlarged, exploded view of an assemblage of the invention.

FIG. 2 shows an enlarged, exploded view of a single electrical device of one embodiment of the invention illustrating the relationships of the various individual parts thereof which may be combined within the standard outline of housing 10. Cathode contacting member 12 is comprised of a material such as oxygen free hard copper which has high electrical and high thermal conductivities. An upwardly extending circumferential restraining member 27 is formed from steel and located on flange 16. Member 27 has an inside diameter suitable for guiding the arrangement of a plurality of diodes 28, or other semiconductor units. Member 27 also defines mounting surface 30 which is suitable for making electrical and thermal contact to each of the diodes.

An aligning shoulder 32 is formed by the cooperation of the top peripheral portion of the surface of flange 16 and the outside portion of restraining member 27 for receiving lower end 33 of upwardly extending hollow cylindrical weld member 34. Also, an annular integral weld ring 35 may be formed on upper end surface 36 of weld member 34. Weld member 34 may be made from stainless steel.

Figure 3:
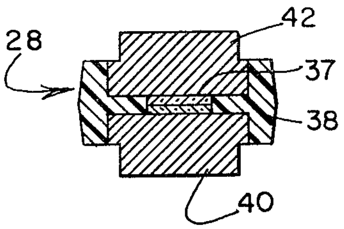
FIG. 3 is an enlarged, cross-sectional view of one of the plurality of diodes included in the assemblage of FIG. 2.

Each diode 28 as shown enlarged and cross-sectioned in FIG. 3, includes P and N material forming a PN junction in a semiconductor material 37 which is encapsulated in a plastic body 38. Each diode also has a first terminal 40 and a second terminal 42 both of which may be made from nickel plated copper. Terminal 40 is electrically connected to the N-type material and terminal 42 is electrically connected to the P-type material. Terminals 40 of the diodes are arranged in a circular configuration abutting against the inside surface of member 27 and against each other so that second terminals 42 form a circle as shown in FIG. 2.

Figure 4:
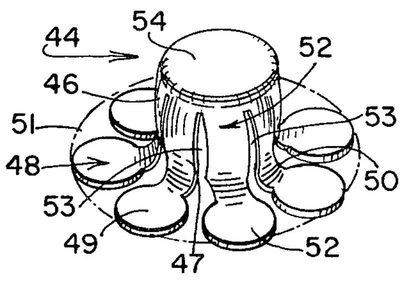
FIG. 4 is an isometric drawing of the flexible member included in the assemblage of FIG. 2.

One-piece flexible member 44, shown in FIGS. 2 and 4, is made of a single piece of resilient material such as soft, annealed copper, having a thickness on the order of fifteen-thousandths of an inch so that it is flexible. Flexible member 44 includes cylindrical body 46 formed by first portions 47 of legs 48. The thickness and width of each leg portion 47 is chosen to facilitate conduction of the maximum current required by the corresponding diode 28. Circular leg sub-portions 49 which are integrally joined at bends 50 to portions 47, have diameters which are greater than the widths of leg portions 47 and facilitate electrical connection with the top terminals 42 of diodes 28. Sub-portions 49 are arranged to form a circle 51 in a first plane which is generally perpendicular to axis 52 of the cylindrical body formed, in part, by leg portions 47. Slots 53 are provided in the side walls of flexible member 44 between each of leg portions 47. A flat, circular contacting portion having contacting surface 54 as shown in FIG. 4, electrically and mechanically joins the first ends of leg portions 47 and lies in a second plane parallel to the first plane. The circular periphery of surface 54 is concentric with circle 51 formed by sub-portions 49.

Figure 5:
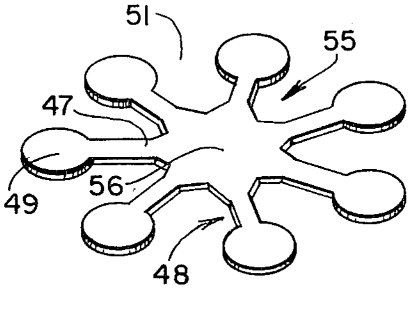
FIG. 5 is an enlarged, isometric view of a blank which is suitable for being formed into the flexible member of FIG. 4.

FIG. 5 illustrates a stamped piece of blank 55 from which flexible member 44 is formed and which includes a plurality of legs 48 extending radially from center point 56. Each leg includes the first portion 47 which is integral with a second portion 49, for making contact with one of diodes 28. Blank 55 is formed by known stamping techniques into flexible member 44 of FIG. 4, which was previously described.

Figure 6:
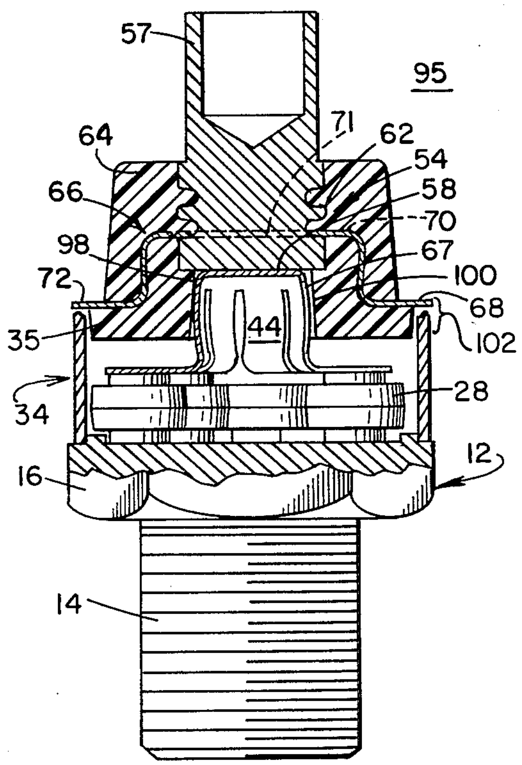
FIG. 6 is an enlarged, cross-sectional drawing of a high power, solid state device formed by assembling the parts of FIG. 2, and wherein the weld members thereof are separated by a predetermined amount and the flexible member is in an extended position.

Anode contacting member 57 of FIG. 2 which is comprised of a conductive material such as oxygen free high conductivity copper, has a contacting surface 58 at one end 59 thereof for making contact with surface 54 of flexible member 44. Socket 60 is formed in the other end 61 of anode contactor 57 for receiving a standard flex lead connector. Circumferential locking members 62 extend from the side of anode contactor 57 near end 59 to form an interlock with encapsulating body 64 which is molded around a portion of second contacting member 57 and around a portion of weld member 66, as shown in FIG. 6. Body 64 may be comprised of plastic material molded in the shape of a truncated cone having an aperture of hole 67 extending therethrough, as shown in FIG. 2.

Weld member 66, which is partially embedded in insulating body 64, is formed from a thin piece of material, such as stainless steel, which is suitable for being welded to weld ring 35 located on end 36 of cylindrical member 34. Member 66 includes a first, flat circular portion 68 laying in a first plane and having an outside diameter which is about equal to the diameter of weld member 34. A circular aperture through which contacting member 57 can pass, as shown in FIG. 6, is provided in portion 68. A hollow cylindrical weld member portion 69 having first and second ends is integral with and extends from portion 68 of weld member 66. The inside diameter of member 69 is about equal to the diameter of the aperture in portion 68. Second flat circular portion 70 lies in a plane parallel to the plane of first circular portion 68 and has an outside diameter approximately equal to the diameter and integral with cylindrical portion 69. A circular aperture 71 is provided in circular portion 70. Apertures 67, 71, the aperture in portion 68 of weld member 66, and the hollow part of weld member 34 are all concentric with each other and of increasing diameter with respect to each other.

Circular edge portion 72 of weld member 66 protrudes through encapsulating body 64, as shown in FIG. 6, so that the housing piece part comprised of second contacting member 57, encapsulating body 64 and weld member 66 may be affixed to cylindrical weld member 34 by welding.

Figure 7:
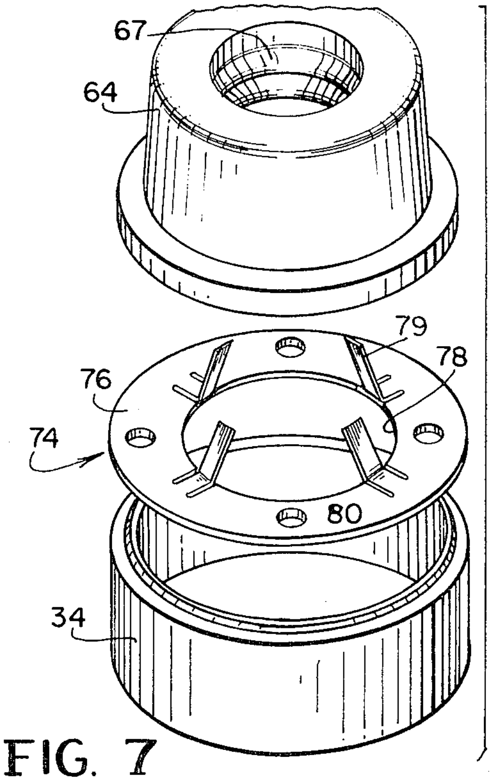
FIG. 7 is a perspective view of an alternate housing connecting member which can be used in place of the housing connecting member shown in FIGS. 2 and 6.

A second circular weld member 74, which can be used in place of weld member 66 of FIG. 2, is shown in FIG. 7. Weld member 74 can also be formed from a thin piece of stainless steel by known techniques and partially embedded in body 64 in a manner similar to that shown in FIG. 6 with respect to weld member 66. Weld member 74 includes a generally flat circular portion 76 having a circular aperture 78 located therein through which contacting member 57 can pass. A plurality of finger portions 79, which extend at angles of about 65° away from the plane of flat portion 76 and circular holes 80, which are equally spaced about aperture 78, facilitate mechanical interlocking between insulating body 64 and weld member 74.

During assembly, cylindrical weld member 34 is first attached by brazing, for instance, to first contacting member 12. Then solder preforms 90, shown in FIG. 2, are placed on mounting surface 30 near restraining member 27. Next, terminals 40 of semiconductor diodes 28 are placed in contact with the solder preforms and with their plastic housings 38 in abutting relation. Solder preforms 92 are then placed on top of the terminals 42 of each of diodes 28 and flexible member 44 is placed on top of preforms 92 with each of circular portions 49 placed directly over each of the diodes. A solder preform 94 may be placed on top of contacting surface 50 of flexible member 44. Alternatively, the contacting surfaces of member 44 could be "pre-tinned" with solder instead of using preforms 92 and 94. Body 64, which includes second contacting member 57 and either weld ring 66 or 74, is next oriented with respect to flexible member 44 so that contacting surface 58 of member 57 is placed on solder preform 94. Because of the flexibility of legs 48, a slight compressive force applied by member 57 causes leg portions 49 of flexible member 44 to contact solder preforms 92 even though diodes 28 have unequal heights.

A simple holding jig may be utilized to accomplish the above mentioned assembly steps because the parts of device 95 of FIG. 2 are essentially self jigging. More particularly, aligning shoulder 32 cooperates with the inside lower edge of weld member 34 to hold peripheral flange 16 and member 34 in the desired relation. Member 27 locates diodes 28 in a proper spaced relation. The recessed aperture formed by surfaces 98 and 100 of body 64 in cooperation with contacting surface 58 of second contacting member 57, as shown in FIG. 6, locate second contacting member 57 with respect to flexible member 44.

After the device is assembled as above described, it is next placed in a furnace which simultaneously melts solder preforms 90, 92 and 94 to electrically connect the entire assembly together. As shown in FIG. 6, the height of flexible member 44 is chosen such that the circumferential portion 72 of weld member 66 is not in contact with weld ring 35 when flexible member 44 is in its natural extended position. The length of gap 102 between portion 72 of weld member 66 and weld ring 35 is on the order of ten to fifteen-thousandths of an inch.

Next, electrical tests are performed to discover whether assembled, composite device 95 will perform according to its specifications. If the soldering operation has caused the electrical characteristics of one of the individual diodes 28 to change or if some other fault is discovered during testing, the soldered device can easily be disassembled by returning it to the furnace and pulling it apart while the solder is in a molten state. The device can then be repaired or the parts thereof can be salvaged thereby decreasing the overall expense of manufacture.

If device 95, as assembled in FIG. 6, satisfactorily passes electrical tests, it is placed in a welding fixture (not shown) which applies pushing forces to the bottom surface of cathode contact member 12 and to the top surface of anode contact member 57 to force the two contact members toward each other until the bottom surface of portion 72 of weld ring member 66 abuts against the top surface of weld ring 35. This creates a compressive force of a magnitude predetermined by the material and dimensions of flexible member 44 and the length of gap 102. In response to the predetermined force member 44 deforms as shown at point 104, for instance, of FIG. 8. The predetermined force is partially distributed by legs 48 to each of diodes 28. Flexible member 44 is designed such that the compressive force applied thereby to each diode, when gap 102 is closed is less than about 15 pounds. The maximum magnitude of compressive force applied by flexible member 44 to diodes 28 during fabrication is limited because the distance flexible member 44 can be compressed is limited by the length of gap 102 between weld ring members 66 and 34.

It should also be noted that the individual semiconductor diodes can sustain compressive direct forces of up to about 40 pounds. However, electrical and physical contact is made to the diodes through soldered connections and it is important that pulling forces not be applied to these connections. The device of the invention keeps these connections under compression to protect them and to thereby avoid open circuits which otherwise might occur.

Figure 8:
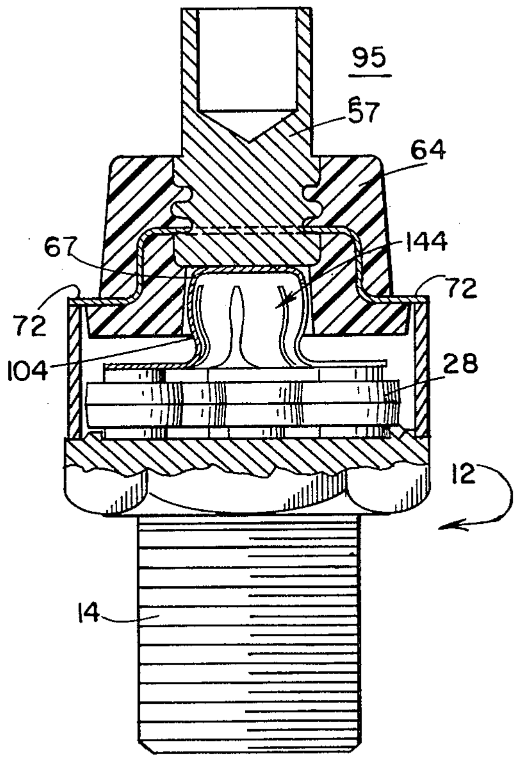
FIG. 8 is another cross-sectional drawing of the high power solid state device similar to the view shown in FIG. 6 but with the weld members thereof being welded together to insure that the flexible member is compressed a predetermined amount.

Finally, weld ring 35 of weld member 34 is welded to portion 72 of weld member 66 to complete the fabrication of high power device 95, as shown partially crosssectioned in FIG. 8.

Assuming that device 95 forms a high power rectifier, alternating voltages having effective or R.M.S. magnitudes greater than 800 volts may be impressed between cathode contacting member 12 and anode contacting member 57. During the portions of the alternating voltage cycles when anode contacting member 57 is positive with respect to cathode contacting member 12, each of diodes 28 simultaneously conducts its distributive share of the total current which may be on the order of 300 amps. Hence, if the electrical characteristics of each diode are closely matched and there are seven diodes connected in parallel by the housing assembly, each diode when forward biased may conduct on the order of 43 amperes and have a forward voltage drop on the order of 1.0 volt. Therefore, during their conductive periods, the diodes 28 convert 300 watts of electrical power into 300 watts of heat power which tends to increase the temperature of all of the parts of electrical device 95 of FIG. 8.

As a result, parts of device 95 expand which results in elongations. As cylindrical member 34 elongates, for instance, it allows first and second contacting members 12 and 57 to move apart thus relieving some of the compressive forces normally applied to flexible member 44. Accordingly, some of the potential energy stored in the curved portions 104 of flexible member 44, for instance, is released to keep surfaces 54 and 58 in electrical contact. Otherwise, if member 44 was formed from a nonflexible material, when the contacting members 12 and 57 moved apart, the electrical current path through device 95 could be broken because the resulting tensile stresses could cause separation of the solder connections.

The dimensions of flexible member 44 are as follows:

| | |
|---|---|
| Diameter of circle **51** | 1.020 inches |
| Diameters of sub-portions **49** | 0.282 inch |
| Height of member **44** | 0.7 inch |
| Diameter of circle **54** | 0.375 inch |
| Radius of bends **50** | 0.070 inch |
| Height of slots **53** | 0.210 inch |
| Widths of leg portions **47** | 0.135 inch |
| Thickness of material forming member **44** | 0.015 inch |

Hence, the invention, as has been described, relates to an assemblage for a high power electrical device including a flexible member which cooperates with a connecting member to facilitate electrical connection within the device even under adverse temperature conditions. Moreover, the flexible member in cooperation with housing portions protects fragile diodes or other semiconductor units during fabrication from mechanical forces which otherwise could destroy them and during operation from thermally created mechanical forces.

We claim:

1. A high power semiconductor device including in combination:

a first contact member comprised of a material having high electrical and thermal conductivities and which provides a supporting surface;

a plurality of individual semiconductor units each having first and second end terminals, said first end terminals being placed in a spaced relation to each other on said supporting surface of said first contact member;

an integral flexible member having a body with first and second ends and an axis, said first end of said body being closed to form a first contacting surface, a plurality of legs having first leg portions extending laterally from said second end of said body, each of said first leg portions making electrical contact with one of said second end terminals of said semiconductor units, said integral flexible member being constructed to bend in response to compressive forces applied along said axis of said body;

a second contact member comprised of a material having a high electrical conductivity and having a second contacting surface abutting against said first contacting surface of said flexible member; and connecting means mechanically coupling said first and second contacting members to each other to hold said flexible member in compression even though said first and second contact members and said contacting means expand in response to temperature increase.

2. The semiconductor device of claim 1 wherein each of said individual semiconductor units further includes:

a semiconductor die having N-type and P-type material providing a PN junction forming a diode;

first terminal member electrically connected to said N-type material;

second terminal member electrically connected to said P-type material;

a housing encapsulating said semiconductor die and portions of said first and second terminal members; and said first terminal members of said semiconductor units being arranged in a circular configuration on said supporting surface of said first contact member so that said semiconductor units extend away from said supporting surface with said second terminal members also being arranged in a circular configuration.

3. The semiconductor device of claim 2 further including:

an annular restraining member extending away from said supporting surface of said first contact member and having an inside surface and an outside surface; and said housings for said semiconductor dice abutting against said inside surface of said restraining member.

4. The semiconductor device of claim 1 wherein:

the periphery of said first end of said body of said flexible member is generally in the shape of a first circle and lies in a first plane;

said plurality of legs further having second leg portions with first ends integral with and extending from said first end of said body in a direction generally perpendicular to said first plane from points equally spaced around the circumference of said first circle to form said body, each of said second leg portions having a second end joining one of said first leg portions; and said first leg portions lying in a second plane which is parallel to said first plane, said first leg portions being equally spaced around the circumference of a second circle having a diameter which is greater than the diameter of said first circle.

5. The semiconductor device of claim 4 wherein:

each of said first leg portions includes a circular sub-portion having a diameter of a predetermined length, said sub-portions making electrical contact with said second end terminals of said semiconductor units; and each of said second leg portions having a predetermined width sufficient to conduct current to each of said semiconductor units, and said width of said second leg portions being less than said diameter of said circular sub-portions.

6. The semiconductor device of claim 5 wherein said first leg portions, said second leg portions, said circular sub-portions and said first end contacting member are integrally connected together and formed from a single shaped piece of soft copper having a thickness on the order of fifteen-thousandths of an inch.

7. The semiconductor device of claim 1 wherein said second contact member has a generally cylindrical shape with first and second ends;

said first end of said second contact member having a socket located therein for receiving a connecting cable;

said second end of said second contact member being closed to form said second contacting surface; and locking means extending from said second contact member near said second end thereof.

8. The semiconductor device of claim 7 wherein said connecting means includes:

a body comprised of insulating material having a first portion enclosing said locking means of said second contacting member;

a first weld member having a first portion embedded in said insulating material of said body and a second portion extending from said insulating material with a first weld portion thereon; and a second weld member in the form of a hollow cylinder, having a first predetermined outside diameter and first and second ends, said first end having a second weld portion thereon.

9. The semiconductor device of claim 8 wherein said first weld member includes:

a first flat, circular portion lying in a plane and having an outside diameter which is essentially equal to said first outside diameter of said second weld member, said circular portion having a first circular aperture located therein which has a second predetermined diameter;

a hollow cylindrical portion having first and second ends, and an inside diameter which is approximately equal to the diameter of said first aperture, said first end of said hollow cylindrical portion being integral with said first flat, circular portion; and a second flat, circular portion lying in a plane parallel to said plane of said first circular portion and having an outside diameter approximately equal to the diameter of said cylindrical portion, and said second circular portion being integral with said second end of said cylindrical portion, said second circular portion having a circular aperture located therein.

10. The semiconductor device of claim 8 wherein:

said second end of said second weld member and said first contact member are mechanically connected to each other;

said body mechanically joins said first weld member and said second contact member;

said second contacting surface of said second contact member is placed in contact with said first contacting surface of said flexible member; and said flexible member has a predetermined height such that said flexible member tends to hold said first weld member and said second weld member a predetermined distance apart, said flexible member being subjected to compressive forces as said first and second weld portions of said first and second weld members are brought into contact, said compressive forces having predetermined maximum magnitudes which are determined by said predetermined distance.

11. In a high power electrical device having a first contact member with a supporting surface thereon, a plurality of individual semiconductor units having first end terminals which are placed on the supporting surface and second end terminals, a second contact member having a first contacting surface, and a connecting member mechanically affixing said first and second contact members together and which has an insulating portion located between the first and second contact member, an integral flexible member located in such housing assembly for making electrical contact between the first contacting surface and the second end terminals of the semiconductor units and including in combination:

a contacting end portion having a second contacting surface for abutting against and making electrical connection with the first contacting surface of the second contact member;

a plurality of legs having first ends integral with said contacting end portions and having integral portions extending therefrom in a generally perpendicular direction with respect to said legs, said legs being comprised of flexible material, and said legs being arranged to make electrical connection with the second end terminals of the semiconductor units; and said flexible member being subjected to compressive forces applied through the first and second contact members to maintain said electrical connection between the second end terminals of the semiconductor units and the first contacting surface of the second contact member in response to thermal expansion of the device.

12. The device as defined in claim 11 wherein:

said contacting end portion of said flexible member has a periphery generally in the shape of a first circle which lies in a first plane;

said plurality of legs extending from points equally spaced around the circumference of said first circle and in directions generally perpendicular to said first plane; and each of said plurality of legs having a leg sub-portion integral therewith which extends at a substantially right angle from the rest of said leg, said leg sub-portion lying in a second plane which is parallel to said first plane, and said leg sub-portions being equally spaced around the circumference of a second circle having a diameter which is greater than the diameter of said first circle.

13. The combination of claim 12 wherein said legs, said leg sub-portions, and said contacting end portion are integrally connected together and form from a single shaped piece of soft copper having a thickness on the order of fifteen-thousandths of an inch.

* * * * *